United States Patent [19]
Kanetake et al.

[11] Patent Number: 5,261,998
[45] Date of Patent: Nov. 16, 1993

[54] METHOD FOR DETECTING AN END POINT OF ETCHING IN SEMICONDUCTOR MANUFACTURE USING THE EMISSION SPECTRUM OF HELIUM

[75] Inventors: Shigehiko Kanetake; Toshihiko Katsura, both of Kawasaki; Masahiro Abe, Yokohama, all of Japan

[73] Assignee: Kabushiki Kaisha Toshiba, Kawasaki, Japan

[21] Appl. No.: 950,140

[22] Filed: Sep. 24, 1992

[30] Foreign Application Priority Data

Sep. 26, 1991 [JP] Japan .................................. 3-247330

[51] Int. Cl.$^5$ ..................... H01L 21/00; H01L 21/02; H01L 21/302; H01L 21/306
[52] U.S. Cl. ................... 156/626; 156/627; 437/8
[58] Field of Search ..................... 156/626, 627; 437/8

[56] References Cited

U.S. PATENT DOCUMENTS

| | | | |
|---|---|---|---|
| 4,713,141 | 12/1987 | Tsang | 156/626 |
| 4,948,462 | 8/1990 | Rossen | 156/626 |
| 5,180,464 | 1/1993 | Tatsumi et al. | 156/626 |
| 5,198,072 | 3/1993 | Gabriel | 156/627 |

FOREIGN PATENT DOCUMENTS

| | | |
|---|---|---|
| 0003925 | 1/1984 | Japan . |
| 0023113 | 1/1987 | Japan . |
| 0081929 | 4/1988 | Japan . |
| 0244847 | 10/1988 | Japan . |

OTHER PUBLICATIONS

Marcoux, P. Optical methods for end point detection in plasma etching, Proc. Soc. Photo-Opt. Instrum. Eng., 276, 1981, pp. 170–177.

Poulsen, R., Use of optical emission spectra for end point detection in plasma etching, Proc.-Electrochem. Soc., 77-2, 1977, pp. 1058–1070.

Primary Examiner—Brian E. Hearn
Assistant Examiner—B. Everhart
Attorney, Agent, or Firm—Finnegan, Henderson, Farabow, Garrett & Dunner

[57] ABSTRACT

For dry-etching a material such as an aluminum alloy layer, a helium gas is added to an etching gas to detect an end point of etching in the material. When the dry-etching of the material has been completed, an emission spectrum intensity of helium having a single peak occurs.

5 Claims, 3 Drawing Sheets

METHOD FOR DETECTING AN END POINT OF ETCHING IN SEMICONDUCTOR MANUFACTURE USING THE EMISSION SPECTRUM OF HELIUM

BACKGROUND OF THE INVENTION

Field of the Invention

The present invention relates to a method for detecting an end point of etching, and more particularly, to a method for detecting an end point of dry-etching using a plasma emission spectrum.

Description of the Related Art

In conventional dry-etching, the desired amount of etching is controlled by the etching time. Practically, in the case where etching reproducibility is good, no problems occur with the use of time controlled etching. However, in cases where etching reproducibility is inadequate, with time controlled etching, different over-etching times occur for every substrate in batch processing, or in single wafer processing, thereby resulting in decreased etching precision. Therefore, in such cases, the control of the amount of etching has been performed by inspection. However, it is necessary that a worker always observe the etching condition during etching, which burdens the production of semiconductor devices.

More recently, a plasma emission spectrum intensity has been monitored in reactive ion etching (hereinafter referred to as RIE) as a method for etching control. More specifically, the RIE method detects an end point of etching at the time when a film, not covered with an etching mask, is completely etched.

The prior art end point detection of etching will be described with reference to FIG. 5 as an example for etching an Al or Al alloy film formed on an insulating film. In this case, samples a and b having the same structure are continuously etched by a single wafer processing etcher under the same etching condition, and their spectrum intensities are measured by the wavelength 396 nm of Al. FIG. 5 shows a variation in the spectrum intensities of Al with respect to the etching time. In FIG. 5, $t_0$ indicates the time when etching of Al starts, and $t_3$ denotes the time when the etching is actually finished by worker inspection, i.e., $t_3$ denotes the end point of etching.

The etching end time provided by the waveform of FIG. 5 is obtained, for example, by the sample a. First, an average $(It_{1a}+It_{2a})/(It_{2a}-It_{1a})$ of the emission spectrum intensity I in a range between $t_{1a}$ and $t_{2a}$, in which a variation in the emission spectrum intensity is relatively low, is obtained. The time when the emission spectrum intensity I is reduced to 70% of the average is defined as the etching end time $t_{3a}$ of the sample a. Similarly, the etching end time of the sample b is given by $t_{3b}$. However, the actual etching end times of both the samples a and b are $t_3$ and differs from $t_{3a}$ and $t_{3b}$ obtained from the waveforms shown in FIG. 5. Since the waveform of the emission spectrum intensity I lacks reproducibility, an appropriate etching end point cannot be defined even by monitoring the wavelength of Al.

Therefore, even if the substrates have the same structure and of the etching end points determined by inspection are the same, there is little or the no reproducibility of etching. In the case of etching substrates having different structures or etching patterns, etching reproducibility is even less likely. Accordingly, even if the emission spectrum intensity of Al is used, it is difficult to detect the etching end point with high precision and to etch substrates having different structures.

SUMMARY OF THE INVENTION

An object of the present invention is to provide a method for detecting an end point of dry-etching with high reproducibility.

Another object of the present invention is to stably and automatically perform etching with high precision.

A feature of the present invention is that an end point of etching is detected with high reproducibility by monitoring an emission spectrum intensity of helium in dry-etching, using an etching gas including a helium gas.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

DETAILED DESCRIPTION OF THE PREFERRED EMBODIMENTS

An embodiment of the present invention will now be described, with reference to the accompanying drawings.

Figure 1:
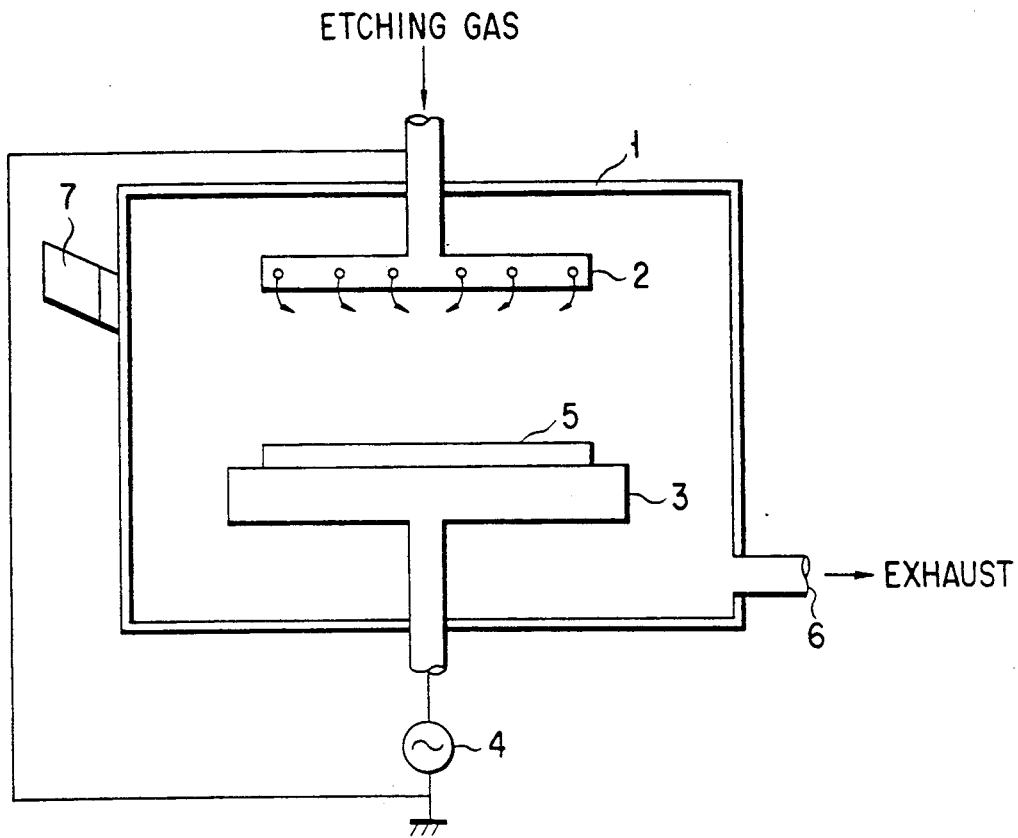
FIG. 1 is a schematic view showing a structure of a dry-etching apparatus for use in a method for detecting an etching end point according to an embodiment of the present invention.

FIG. 1 shows a dry-etching apparatus having a parallel-plate electrode structure. A chamber 1 includes an upper electrode 2 and a lower electrode 3, which are arranged in parallel with each other and connected to a high-frequency power supply 4. An etching gas is introduced from holes of the upper electrode 2 into the chamber 1 and exhausted from an exhaust port 6 provided at a lower portion of the chamber 1. A sample 5 is placed on the upper surface of the lower electrode 3. An emission spectrum filter 7 is attached to the chamber 1 to detect an emission spectrum of the etching gas.

Figure 2:
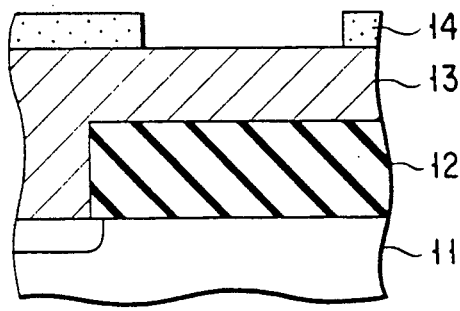
FIG. 2 is a cross-sectional view of a material to be etched according to the embodiment of the present invention.

The sample 5 will be described in detail with reference to FIG. 2. An $SiO_2$ film 12 is formed on a silicon substrate 11. An Al film 13 is deposited over the substrate surface as a wiring layer by sputtering, and an etching mask 14 having a desired wiring pattern is formed on the Al film 13. The Al film 13 formed on the $SiO_2$ film 12 has a thickness of 10000 Å. The Al film 13 is composed of, for example, an Al-Si-Cu alloy.

The Al film 13, which is not covered with the etching mask 14, is etched down to the $SiO_2$ film 12. The process condition is given by an etching gas: $SiCl_4/Cl_2$.

/He=50/100/400[SCCM], a pressure: 100 [Pa], and a power: 300 [W].

Figure 3:
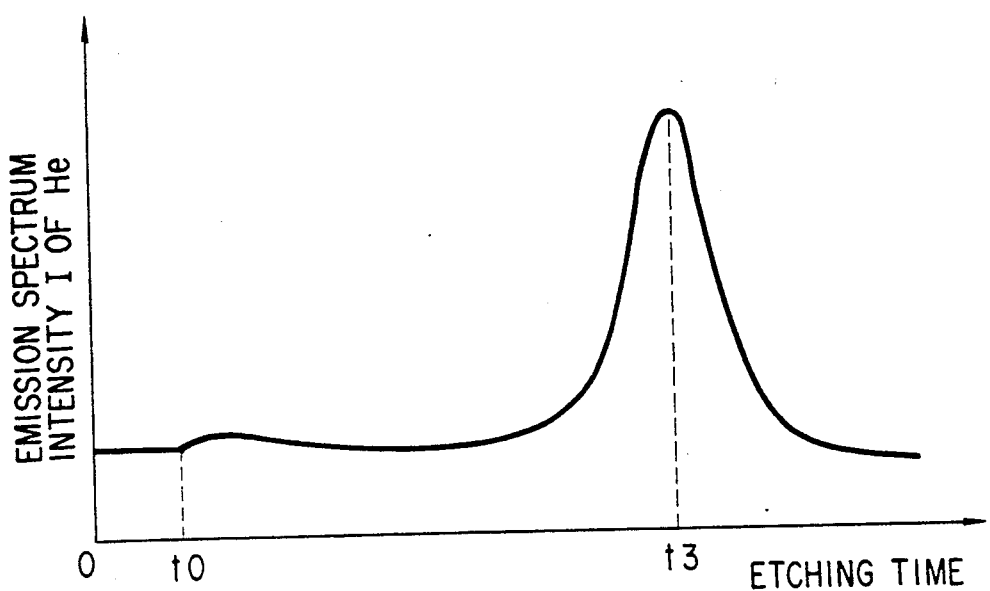
FIG. 3 is a graph showing a variation in emission spectrum intensity of helium with respect to etching time.

For detecting an end point of etching, the emission spectrum of wavelength 439 nm of helium is monitored. The wavelength of helium is monitored through the emission spectrum filter 7. FIG. 3 shows a variation in the emission spectrum intensity of the helium with respect to the etching time. In FIG. 3, $t_0$ indicates the etching start time, and $t_3$ represents the etching end time. The emission spectrum intensity of the helium has a single peak at the end of the etching. This is because the wavelength of Al is the highest during the etching of the Al film 13 and the wavelength of helium becomes extremely high after the etching of the Al film 13 is finished. The etching end time determined by the single peak correctly coincides with the etching end time defined by the inspection.

Figure 4:
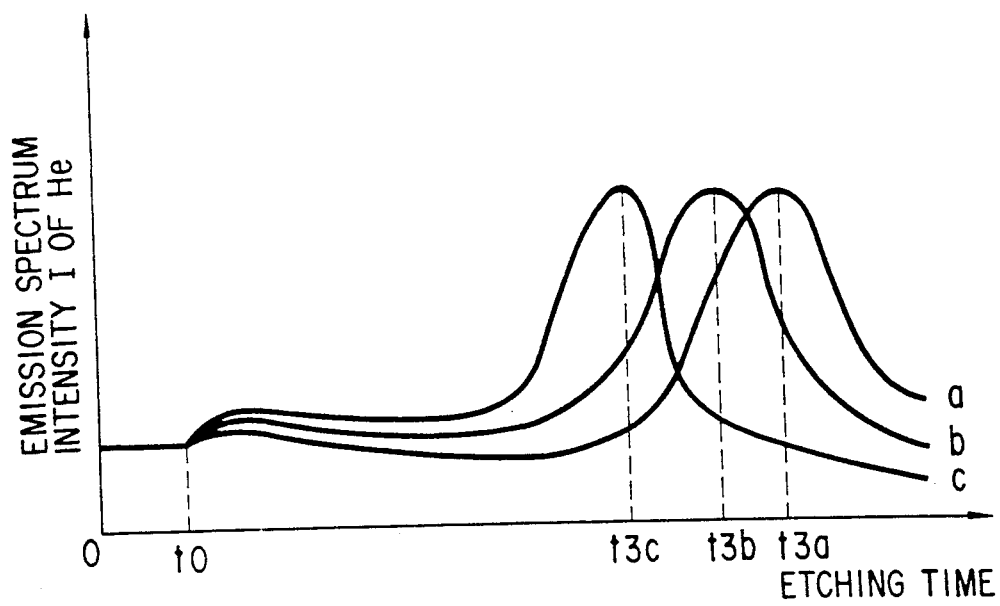
FIG. 4 is a graph showing a variation in emission spectrum intensity of helium with respect to etching time of each of three materials to be etched.
Figure 5:
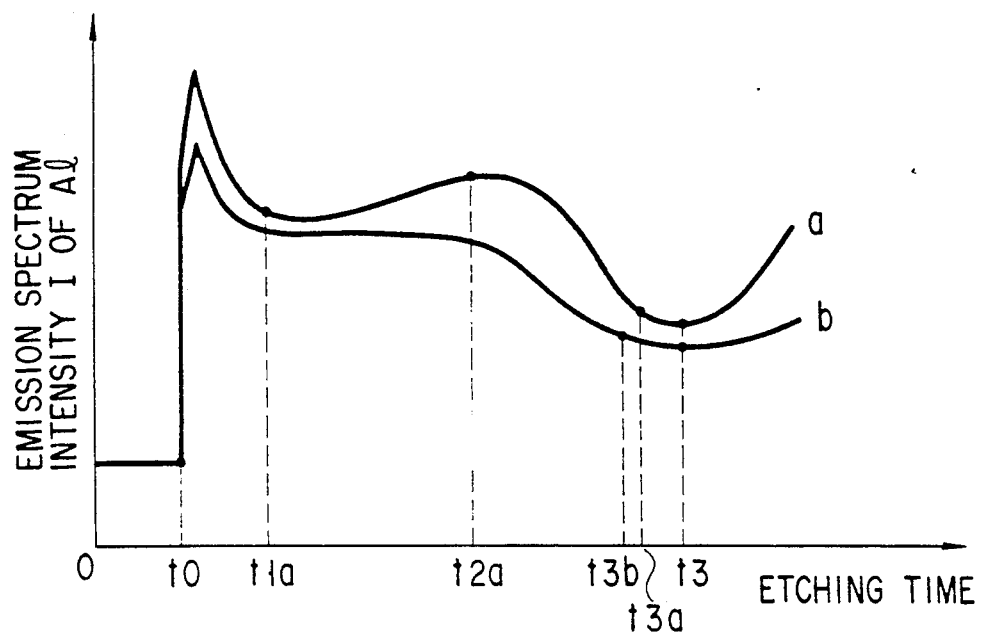
FIG. 5 is a graph showing a variation in emission spectrum intensity of aluminum with respect to etching time.

Furthermore, three samples a, b and c having the same structure as that of the sample 5 are continuously etched under the same condition as that of the sample 5. A variation in the emission spectrum intensity of helium in this case is shown in FIG. 4. Although the etching end times of the three samples differ from one another, the emission spectrum intensity of helium of each of the samples has a single peak, and the etching end times $t_{3a}$, $t_{3b}$ and $t_{3c}$ corresponding to the peaks are easily detected. In other words, even if the samples having the same structure are etched in sequence and the etching end times of the samples do not coincide with one another, the etching end points can be easily detected with high precision, since the single peak of the emission spectrum intensity of helium of each sample always appears at the end of the etching.

As another embodiment, the present invention can be applied to a case where an insulating film such as an $SiO_2$ film is etched. The etching apparatus is the same as that shown in FIG. 1, and the process condition is given by an etching gas: $CHF_3/SF_6/He = 50/10/200[SCCM]$, a pressure: 100[Pa], and a power: 500 [W]. Since, in this embodiment, the emission spectrum intensity of helium has a single peak, an etching end point can be detected.

In the above embodiments, the emission spectrum intensity of helium has a single peak during etching, and high-precision etching can be performed. Since the emission spectrum of a helium gas is used, an etching end point can be easily detected, irrespective of the structure (etching pattern) of a substrate or a material to be etched. Not only the high-precision etching can be attained, but also the etching process can be stabilized. Further, since good etching reproducibility is obtained, the etching process can be automated.

The present invention is applied to etching of the Al film and the insulating film, as described above. However, it can be applied to all dry-etching using a process gas containing a helium gas irrespective of a material to be etched.

It is further understood by those skilled in the art that the foregoing description is only of the preferred embodiments and that various changes and modifications may be made in the invention without departing from the spirit and scope thereof.

What is claimed is:

1. A method for detecting an end point in dry-etching comprising the steps of:
    preparing a chamber including a pair of parallel-plate electrodes;
    disposing a material to be dry-etching on one of said pair of parallel-plate electrodes;
    introducing into said chamber an etching gas containing a helium gas; and
    applying a high frequency voltage across said pair of parallel-plate electrodes to dry-etch said material, while monitoring an emission spectrum intensity of said helium gas having a wavelength of 439 nm to detect a peak of said emission spectrum intensity thereof as an end point of dry-etching.

2. The method according to claim 1, wherein said peak of said emission spectrum intensity of helium is single.

3. The method according to claim 1, wherein said peak of said emission spectrum intensity of helium occurs after said dry-etching of said material has been completed.

4. The method according to claim 1, wherein said emission spectrum intensity of helium is detected by an emission spectrum filter attached to a window of said chamber.

5. The method according to claim 1, wherein said material is selected from aluminum aluminum alloys, polysilicon, metals, and insulators including silicon oxide.

* * * * *